(12) United States Patent
Ramakrishna et al.

(10) Patent No.: US 7,242,091 B2
(45) Date of Patent: Jul. 10, 2007

(54) STACKED SEMICONDUCTOR PACKAGES AND METHOD THEREFOR

(75) Inventors: Kambhampati Ramakrishna, Chandler, AZ (US); Il Kwon Shim, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 156 days.

(21) Appl. No.: 10/906,697

(22) Filed: Mar. 2, 2005

(65) Prior Publication Data
US 2006/0197205 A1 Sep. 7, 2006

(51) Int. Cl.
H01L 23/34 (2006.01)
(52) U.S. Cl. ............... 257/723; 257/777; 438/107
(58) Field of Classification Search ............... 257/723, 257/777, 666
See application file for complete search history.

(56) References Cited

U.S. PATENT DOCUMENTS

| | | | |
|---|---|---|---|
| 5,978,227 A * | 11/1999 | Burns | 361/735 |
| 6,459,148 B1 * | 10/2002 | Chun-Jen et al. | 257/692 |
| 6,509,639 B1 | 1/2003 | Lin | 257/686 |
| 6,512,290 B2 | 1/2003 | Kinsman et al. | 257/692 |
| 6,531,764 B2 | 3/2003 | Kinsman et al. | 257/676 |
| 6,656,767 B1 | 12/2003 | King et al. | 438/107 |
| 6,753,207 B2 | 6/2004 | Hur | 438/109 |
| 6,765,287 B1 | 7/2004 | Lin | 257/686 |
| 6,773,955 B2 | 8/2004 | Moden et al. | 438/106 |
| 6,773,959 B2 | 8/2004 | Yau | 438/109 |
| 6,794,741 B1 | 9/2004 | Lin et al. | 257/686 |
| 6,806,120 B2 | 10/2004 | Wehrly, Jr. | 438/109 |
| 6,828,665 B2 | 12/2004 | Pu et al. | 257/686 |

* cited by examiner

Primary Examiner—Roy Potter
(74) Attorney, Agent, or Firm—Mikio Ishimaru

(57) ABSTRACT

A stackable semiconductor package and method includes providing a first semiconductor package having a first plurality of lower leads and a first plurality of upper leads. A second semiconductor package having a second plurality of lower leads is provided. The second plurality of lower leads is attached to the first plurality of upper leads to form a stack of semiconductor packages.

20 Claims, 11 Drawing Sheets

STACKED SEMICONDUCTOR PACKAGES AND METHOD THEREFOR

TECHNICAL FIELD

The present invention relates generally to semiconductors, and more particularly to stacked semiconductor packages and methods for stacking semiconductor packages.

BACKGROUND ART

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Semiconductor chips have input/output leads that are connected to external circuitry in order to function as part of an electronic system. Traditionally, a single chip is individually housed in a single-chip package that is connected to other single-chip packages through a printed circuit board, which supplies power to the chips and provides signal routing among the chips. The single-chip package has connection media that is typically an array of metallic leads.

Multi-chip modules (MCM) or hybrid modules that package multiple chips on a common platform are an alternative to single-chip packages. These modules aim to achieve higher packaging density. Conventional multi-chip modules are essentially two-dimensional structures with multiple chips connected to a planar interconnection substrate, which contains traces to supply power and signal transmission. However, since multi-chip modules utilize a planar interconnection substrate as the base, their effectiveness in packaging density is limited. Therefore, in order to create higher density packages, reduce area requirements and shorten signal transmission distances, three-dimensional packages with two, three or more vertically stacked chips are an emerging trend. Three-dimensional packages are particularly suitable for the electronic systems such as supercomputers and other complex systems that require high operating speed and high capacity in very limited space.

Three-dimensional packages generally follow two approaches. In one approach, individual chips are packaged in conventional single-chip packages and then the single-chip packages are vertically stacked and interconnected to one another. In another approach, leads are connected to the chips, and then the exposed leaded chips are vertically stacked and interconnected to one another using peripheral interconnections.

One drawback with many conventional three-dimensional packages is that the vertical interconnections lack the flexibility to accommodate thickness variations of the stacked semiconductors. For instance, chip thickness may vary by 20 microns or more even after backside wafer polishing attempts to planarize the wafer. As a result, vertical interconnections with fixed heights cannot adequately accommodate these thickness variations, and suffer from disoriented, cracked, and open connections, high mechanical stress, and reliability problems.

In summary, conventional three-dimensional packages suffer from numerous deficiencies including large area requirements, inflexible vertical interconnections, limited electrical performance, poor strength, and low reliability. Moreover, conventional three-dimensional packages are often unsuitable for test and repair, manufactured by complicated processes that are impractical for volume production, and too difficult and costly to develop.

In view of the various development stages and limitations in currently available three-dimensional packages, there is a need for a three-dimensional semiconductor package that is cost-effective, reliable, manufacturable, and provides excellent mechanical and electrical performance.

Solutions to these problems have been long sought but prior developments have not taught or suggested any solutions and, thus, solutions to these problems have long eluded those skilled in the art.

DISCLOSURE OF THE INVENTION

The present invention provides a stackable semiconductor package and method including a first semiconductor package having a first plurality of lower leads and a first plurality of upper leads. A second semiconductor package having a second plurality of lower leads is provided. The second plurality of lower leads is attached to the first plurality of upper leads to form a stack of semiconductor packages.

The present invention provides a semiconductor package that can be stacked using convention manufacturing equipment and processes.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
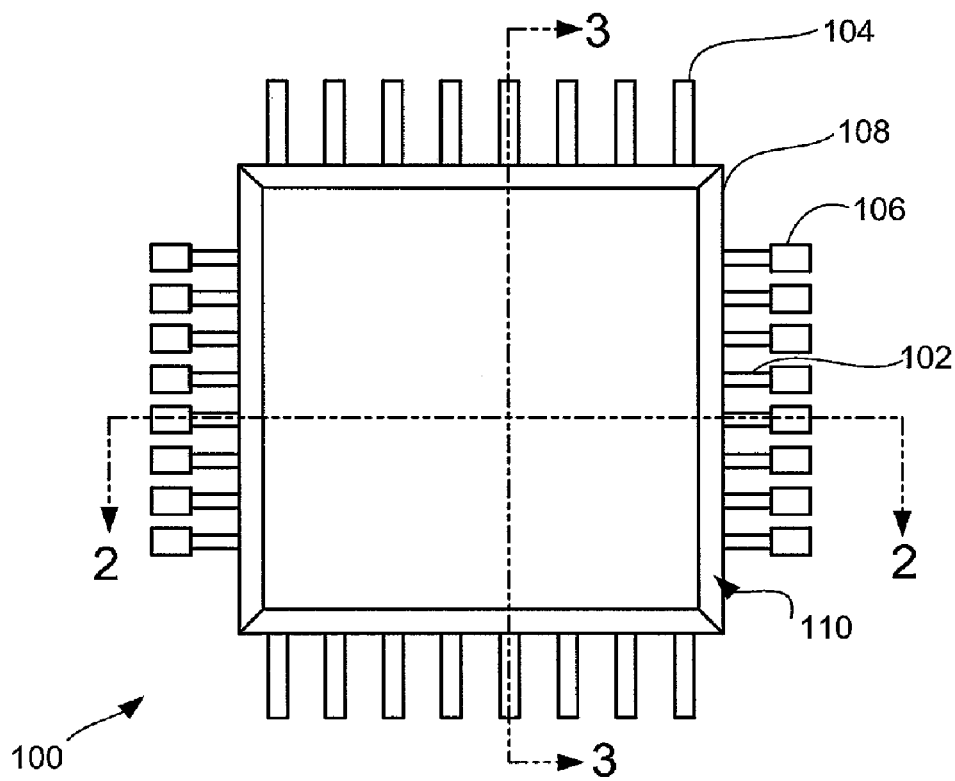
FIG. 1 is a top view of a semiconductor package with upper and lower gull-wing leads on opposing sides of the semiconductor package.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the devices are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the semiconductor package, regardless of its orientation. The term "vertical" refers to a direction perpendicular to the horizontal as just defined. Terms, such as "on", "above", "below", "bottom", "top", "upper", "side" (as in "sidewall"), "higher", "lower", "over", and "under", are defined with respect to the horizontal plane.

Referring now to FIG. 1, therein is shown a top view of a semiconductor package 110 with a number of upper gull wing leads 112 and a number of lower gull-wing leads 114 on opposing sides of the semiconductor package 110. The number of upper gull-wing leads 112 has a number of widened lead tips 116. Typically, the number of widened lead tips 116 is pre-plated to facilitate connection of the number of upper gull-wing leads 112 as described below. The semiconductor package 110 includes an encapsulant 118 from which the upper gull-wing leads 112 and the number of lower gull-wing leads 114 extend. The encapsulant 118 typically is a plastic, epoxy resin, or other suitable molding compound. The encapsulant typically has a sloped perimeter 111 to facilitate removal of the semiconductor package 110 from a mold.

Figure 2:
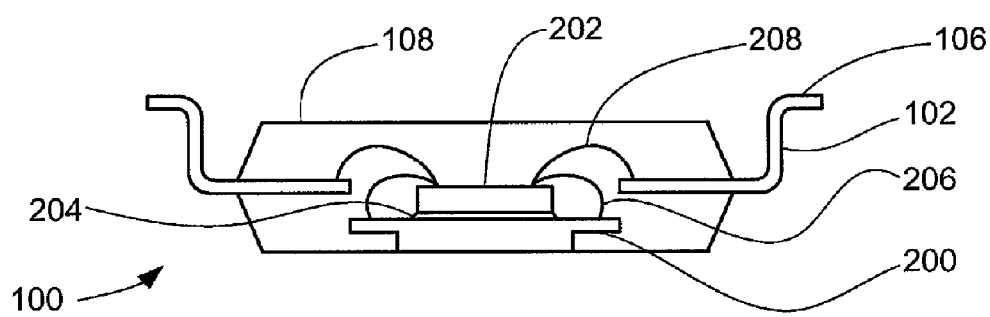
FIG. 2 is a cross-sectional view of the structure of FIG. 1 taken along line 2-2.

Referring now to FIG. 2, therein is shown a cross-sectional view of the structure of FIG. 1 taken along line 2-2. The semiconductor package 110 includes a die pad 200. An integrated circuit chip, or a die 202, is attached to the die pad 200 using a suitable adhesive layer 204, such as a conductive adhesive paste or tape. The die 202 is wire bonded to the die pad 200 using a first number of bonding wires 206, such as a plurality of fine, conductive wires, typically gold (Au) or aluminum (Al). The die 202 also is wire bonded to the upper gull-wing leads 112 using a second number of bonding wires 208.

The encapsulant 118 encloses the die 202 and the bonding wires 206 and 208. The upper gull-wing leads 112 extend outwardly from the encapsulant 118 to allow electrical connection of the die 202 to a second semiconductor package as explained below.

Figure 3:
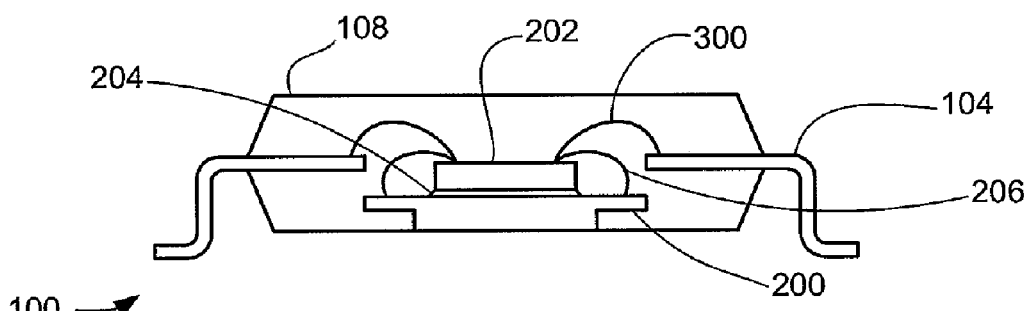
FIG. 3 is a cross-sectional view of the structure of FIG. 1 taken along line 3-3.

Referring now to FIG. 3, therein is shown a cross-sectional view of the structure of FIG. 1 taken along line 3-3. The die 202 is wire bonded to the lower gull-wing leads 114 using a third number of bonding wires 300. The third number of bonding wires 300 is connected using any suitable wire bonding process. The lower gull-wing leads 114 are used for attachment to another semiconductor package or printed circuit board (PCB).

Figure 4:
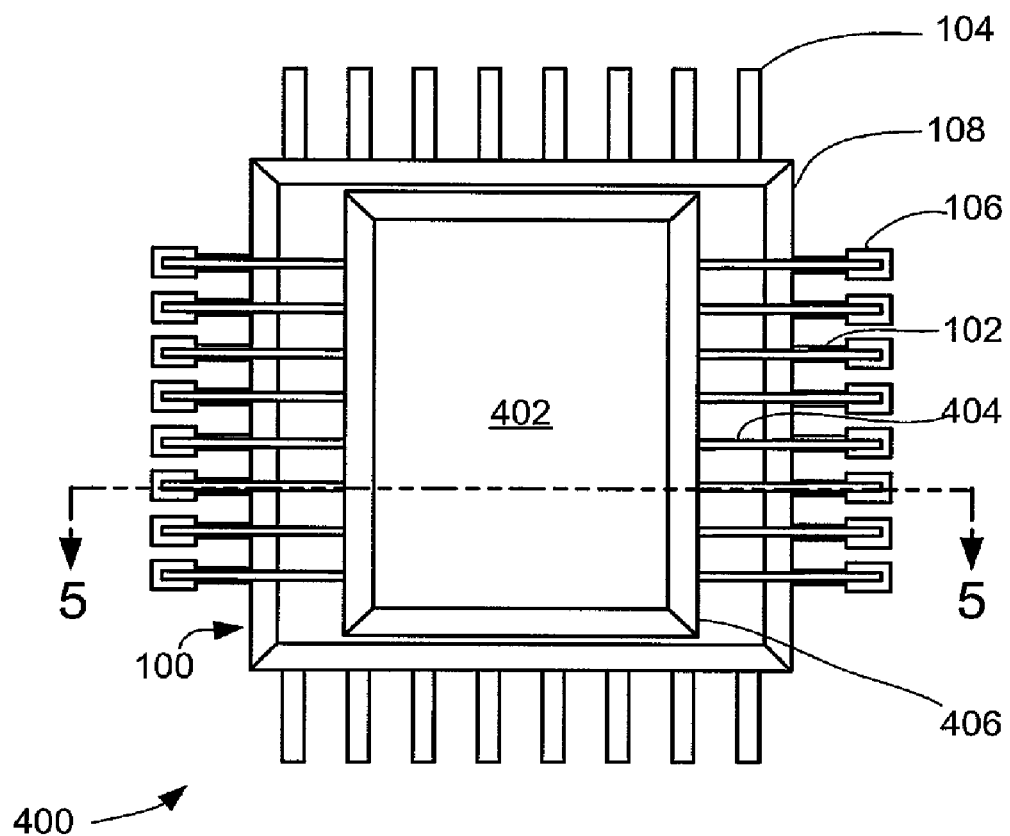
FIG. 4 is a top view of stacked semiconductor packages with upper and lower gull-wing leads on one of the semiconductor packages.

Referring now to FIG. 4, therein is shown a top view of a stack of semiconductor packages 400 with a number of upper gull-wing leads 112 and a number of lower gull-wing leads 114 on the semiconductor package 110. The semiconductor package 110 shown in FIGS. 1-3 is referred to as the bottom semiconductor package 110 shown in FIG. 4. A second semiconductor package 402 is attached to the bottom semiconductor package 110. The second semiconductor package 402 includes a third number of lower gull-wing leads 404 extending outwardly from a second encapsulant 406.

The third number of lower gull-wing leads 404 is connected to the number of upper gull-wing leads 112 at the number of widened terminal pads 116 using conventional bonding techniques known in the semiconductor industry.

Figure 5:
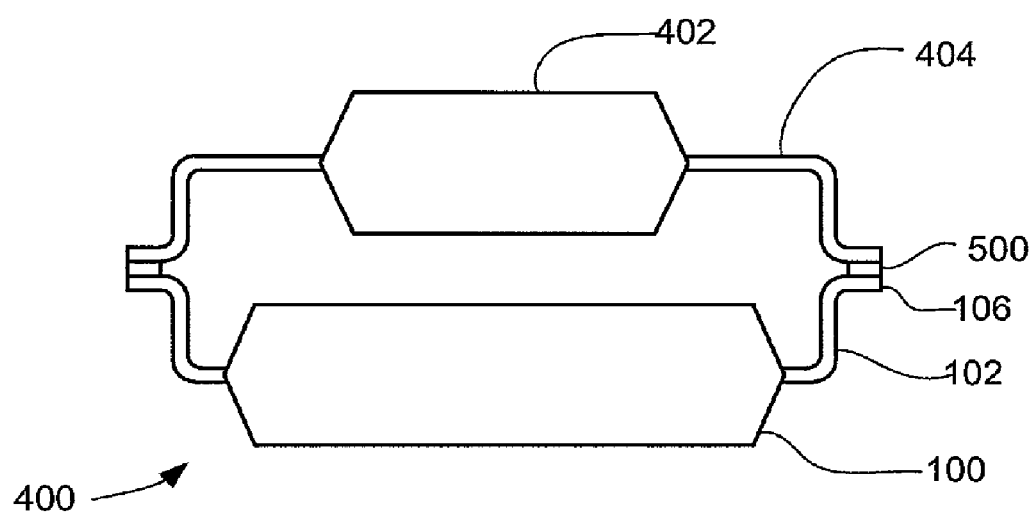
FIG. 5 is a cross-sectional view of the structure of FIG. 4 taken along line 5-5.

Referring now to FIG. 5, therein is shown a cross-sectional view of the structure of FIG. 4 taken along line 5-5. The second semiconductor package 402 is connected to the bottom semiconductor package 110. The third number of upper gull-wing leads 404 is soldered to the number of upper gull-wing leads 112 at the widened lead tip 116 using a solder 500, such as a eutectic solder, a high lead solder, a lead-free solder, a pre-form solder, an electrically and thermally conductive paste adhesive, an electrically and thermally conductive film adhesive, and combinations thereof.

Other suitable bonding techniques, such as compression bonding or ultrasonic bonding, for example, also may be used to connect the third number of upper gull-wing leads 404 to the number of upper gull-wing leads 112 to form the stack of semiconductor packages 400. Typically, the second semiconductor package 402 is attached to the bottom semiconductor package 110 at board assembly to avoid possible damage to the numbers of leads that may occur while picking and placing the stack of semiconductor packages 400 as a unit.

It will be apparent to those skilled in the art upon a reading of this disclosure that the second semiconductor package 402 may also include a number of upper gull-wing leads for stacking another semiconductor package onto the second semiconductor package 402.

Figure 6:
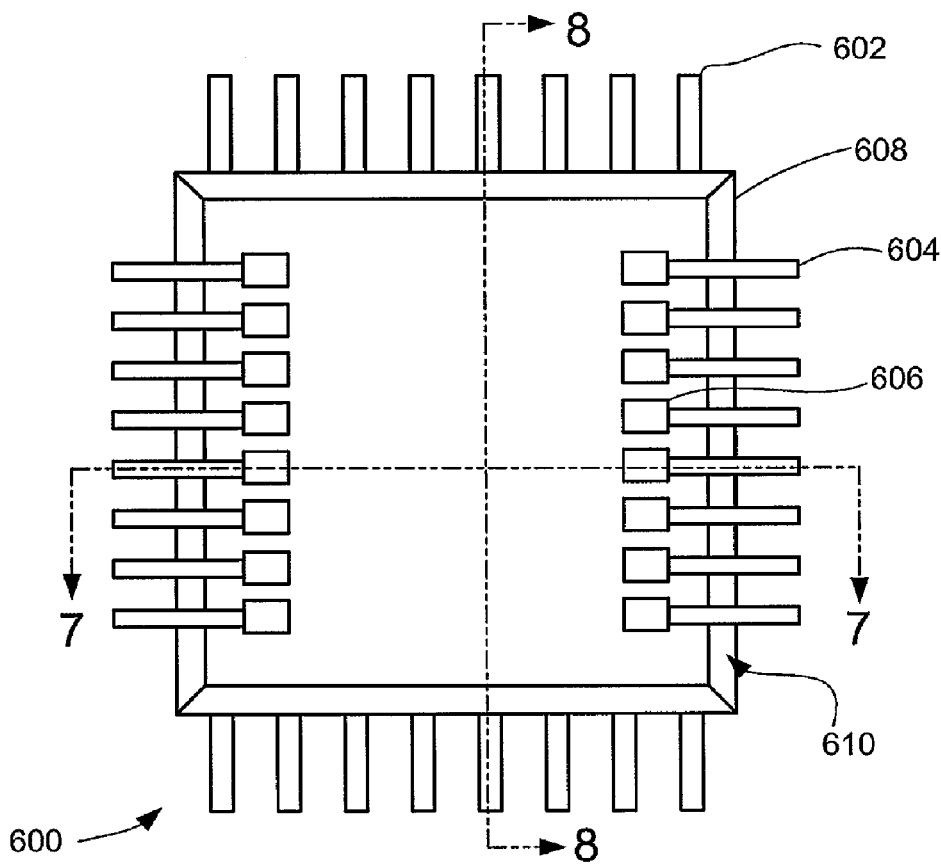
FIG. 6 is a top view of a semiconductor package having gull-wing leads and J-bent leads on opposing sides of the semiconductor package.

Referring now to FIG. 6, therein is shown a top view of a semiconductor package 600 having a number of lower gull-wing leads 602 and a number of upper J-bent leads 604 on opposing sides of the semiconductor package 600. The number of upper J-bent leads 604 have a widened lead tip 606. Typically, the widened lead tip 606 is pre-plated, for example with tin-lead solder, lead-free solder, nickel-palladium-gold alloy, or a combination thereof, to facilitate connection of the number of upper J-bent leads 604 as described below. The semiconductor package 600 includes an encapsulant 608 from which the number of upper J-bent leads 604 and the number of lower gull-wing leads 602 extends. The encapsulant 608 typically is a plastic, epoxy resin, or other suitable molding compound. The encapsulant typically has a sloped perimeter 610 to facilitate removal of the semiconductor package 600 from a mold.

Figure 7:
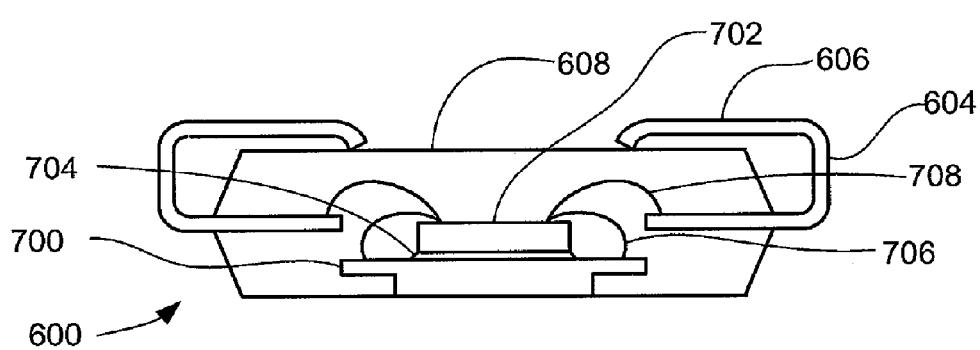
FIG. 7 is a cross-sectional view of the structure of FIG. 6 taken along line 7-7.

Referring now to FIG. 7, therein is shown a cross-sectional view of the structure of FIG. 6 taken along line 7-7. The semiconductor package 600 includes a die pad 700. An integrated circuit chip, or a die 702, is attached to the die pad 700 using a suitable adhesive layer 704, such as a conductive adhesive paste or tape. The die 702 is wire bonded to the die pad 700 using a first number of bonding wires 706, such as a plurality of fine, conductive wires, typically gold (Au) or aluminum (Al). The die 702 also is wire bonded to the number of upper J-bent leads 604 using a second number of bonding wires 708.

The encapsulant 608 encloses the die 702 and the bonding wires 706 and 708. The upper J-bent leads 604 extend outwardly from the encapsulant 608 to allow electrical connection of the die 702 to a second semiconductor package as explained below.

Figure 8:
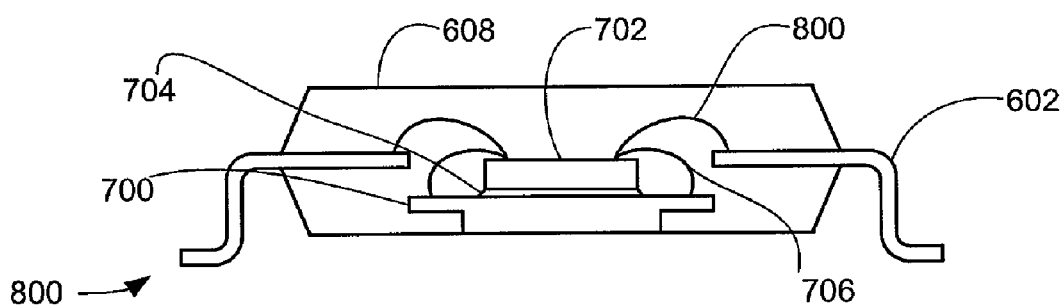
FIG. 8 is a cross-sectional view of the structure of FIG. 6 taken along line 8-8.

Referring now to FIG. 8, therein is shown a cross-sectional view of the structure of FIG. 6 taken along line 8-8. The die 702 is wire bonded to the number of lower gull-wing leads 602 using a third number of bonding wires 800. The third number of bonding wires 800 is connected using any suitable wire bonding process. The number of lower gull-wing leads 602 is used for attachment to another semiconductor package or printed circuit board (PCB).

Figure 9:
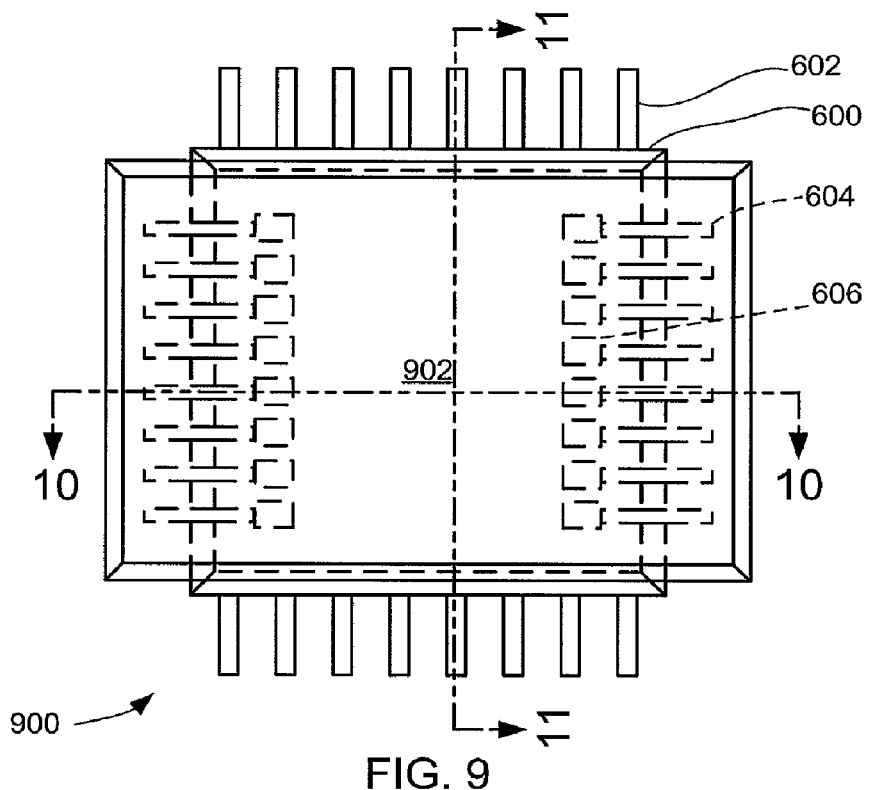
FIG. 9 is a top view of stacked semiconductor packages with J-bent leads.

Referring now to FIG. 9, therein is shown a top view of a stack of semiconductor packages 900 with the number of J-bent leads 604 on the bottom semiconductor package 600. The semiconductor package 600 shown in FIGS. 6-8 is the bottom semiconductor package 600 shown in FIG. 9. A second semiconductor package 902 is attached to the number of upper J-bent leads 604 of the bottom semiconductor package 600 at the widened lead tips 606.

Figure 11:
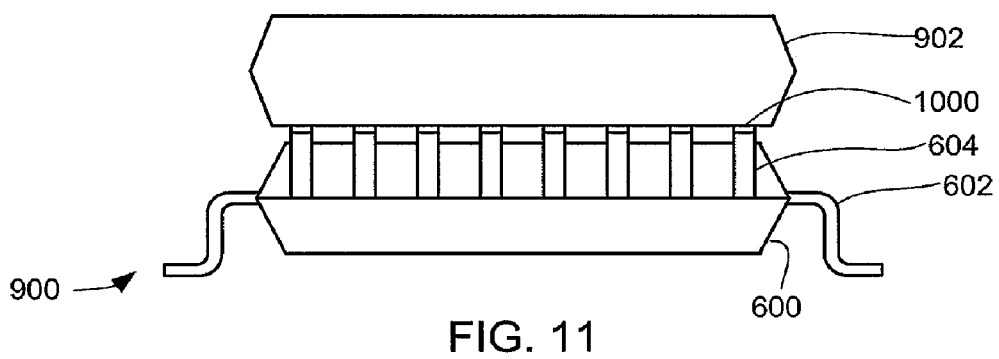
FIG. 11 is a cross-sectional view of the structure of FIG. 9 taken along line 11-11.

Referring now to FIG. 11, therein is shown a cross-sectional view of the structure of FIG. 9 taken along line 11-11. The second semiconductor package 902 is connected to the bottom semiconductor package 600. The second semiconductor package is a bottom leaded semiconductor package having a number of bottom leads 1100. The number of bottom leads 1000 is soldered to the number of upper J-bent leads 604 at the widened lead tip 606 using a solder, such as a eutectic solder, a high lead solder, a lead-free solder, a pre-form solder, an electrically and thermally conductive paste adhesive, an electrically and thermally conductive film adhesive, and combinations thereof.

Other suitable bonding techniques, such as compression bonding or ultrasonic bonding, for example, also may be used to connect the number of bottom leads 1100 to the number of upper J-bent leads 604 to form the stack of semiconductor packages 900. Typically, the second semiconductor package 902 is attached to the bottom semiconductor package 600 at board assembly to avoid possible damage to the numbers of leads that may occur while picking and placing the stacked semiconductor packages 900 as a unit.

It will be apparent to those skilled in the art upon a reading of this disclosure that the second semiconductor package 902 may also include a number of upper gull-wing leads for stacking another semiconductor package onto the second semiconductor package 902.

Referring now to FIG. 11, therein is shown a cross-sectional view of the structure of FIG. 9 taken along line 11-11. The number of bottom leads 1100 is connected to the number of upper J-bent leads 604 to connect the second semiconductor package 902 to the bottom semiconductor package 600.

Figure 12:
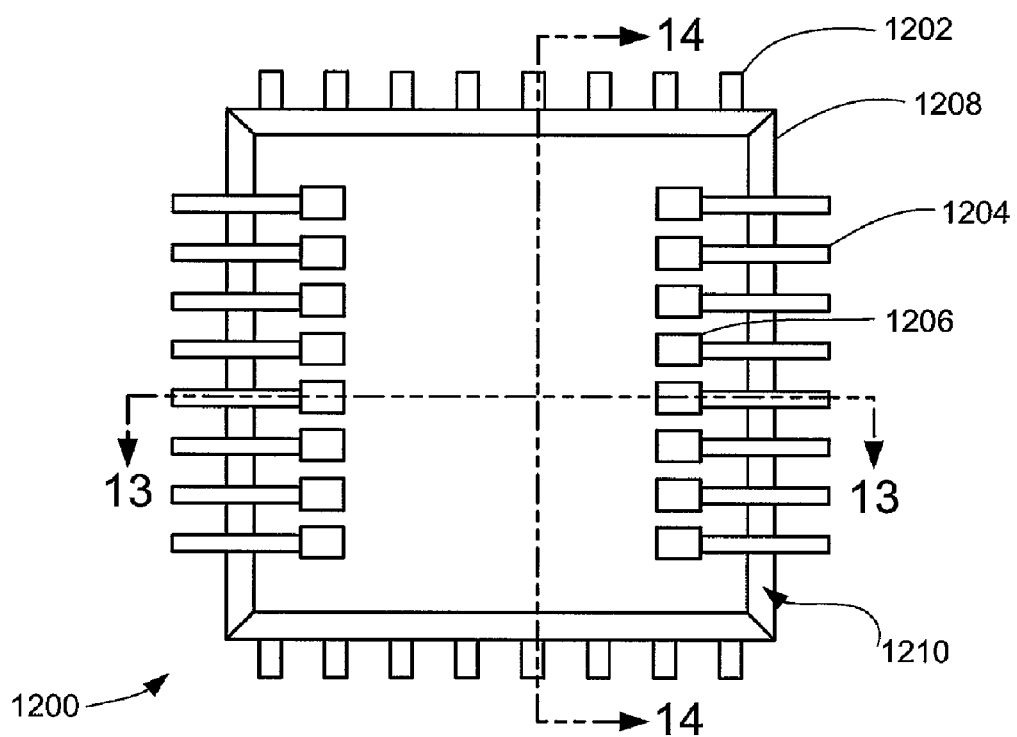
FIG. 12 is a top view of a semiconductor package with upper and lower J-bent leads on opposing sides of the semiconductor package.

Referring now to FIG. 12, therein is shown a top view of a semiconductor package 1200 with a number of lower J-bent leads 1202 and a number of upper J-bent leads 1204 on opposing sides of the semiconductor package 1200. The number of upper J-bent leads 1204 has a number of widened lead tips 1206. Typically, the number of widened lead tips 1206 is pre-plated to facilitate connection of the number of upper J-bent leads 1204 as described below. The semiconductor package 1200 includes an encapsulant 1208 from which the number of lower J-bent leads 1202 and the number of upper J-bent leads 1204 extend. The encapsulant 1208 typically is a plastic, epoxy resin, or other suitable molding compound. The encapsulant typically has a sloped perimeter 1210 to facilitate removal of the semiconductor package 1200 from a mold.

Referring now to FIG. 11, therein is shown a cross-sectional view of the structure of FIG. 12 taken along line 13-13. The semiconductor package 1200 includes a die pad 1100. An integrated circuit chip, or a die 1102, is attached to the die pad 1100 using a suitable adhesive layer 1104, such as a conductive adhesive paste or tape. The die 1102 is wire bonded to the die pad 1100 using a first number of bonding wires 1106, such as a plurality of fine, conductive wires, typically gold (Au) or aluminum (Al). The die 1302 also is wire bonded to the number of upper J-bent leads 1304 using a second number of bonding wires 1308.

The encapsulant 1208 encloses the die 1302 and the bonding wires 1306 and 1308. The upper J-bent leads 1204 extend outwardly from the encapsulant 1208 to allow electrical connection of the die 1102 to a second semiconductor package as explained below.

Referring now to FIG. 11, therein is shown a cross-sectional view of the structure of FIG. 12 taken along line 14-14. The die 1302 is wire bonded to the number of lower J-bent leads 1302 using a third number of bonding wires 1400. The third number of bonding wires 1400 is connected using any suitable wire bonding process. The lower J-bent leads 1102 are used for attachment to another semiconductor package or printed circuit board (PCB).

Figure 13:
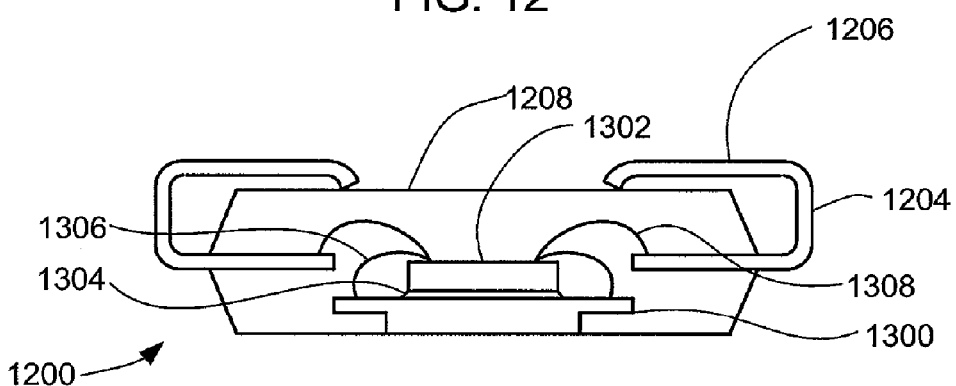
FIG. 13 is a cross-sectional view of the structure of FIG. 12 taken along line 13-13.
Figure 14:
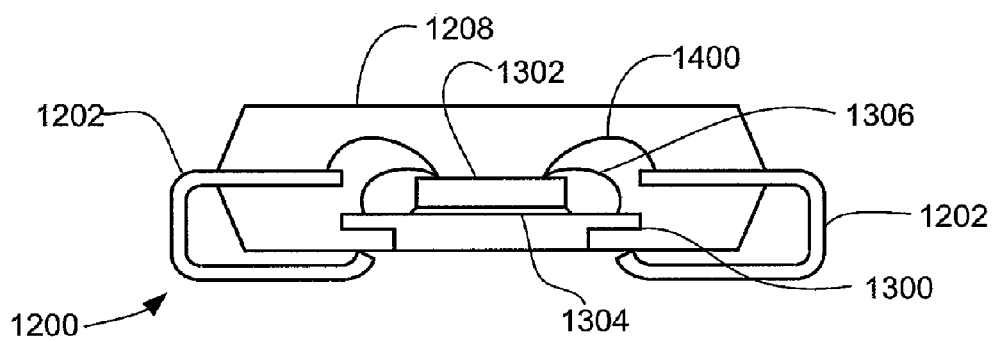
FIG. 14 is a cross-sectional view of the structure of FIG. 12 taken along line 14-14.

Referring now to FIG. 11, therein is shown a top view of a stack of semiconductor packages 1500 with the number of lower J-bent leads 1202 and the number of upper J-bent leads 1204 on opposing sides of one of the bottom semiconductor package 1200. The semiconductor package 1200 shown in FIGS. 12-14 is the bottom semiconductor package 1200 shown in FIG. 15. A second semiconductor package 1502 is attached to the number of upper J-bent leads 1204 of the bottom semiconductor package 1200 at the number of widened lead tips 1206.

Referring now to FIG. 11, therein is shown a cross-sectional view of the structure of FIG. 11 taken along line 11-11. The second semiconductor package 1102 is connected to the bottom semiconductor package 1200. The second semiconductor package 1502 is a bottom leaded semiconductor package having a number of bottom leads 1100. The number of bottom leads 1600 is soldered to the number of upper J-bent leads 1204 at the widened lead tip 1106 using a solder, such as a eutectic solder, a high lead solder, a lead-free solder, a pre-form solder, an electrically and thermally conductive paste adhesive, an electrically and thermally conductive film adhesive, and combinations thereof.

Other suitable bonding techniques, such as compression bonding or ultrasonic bonding, for example, also may be used to connect the number of bottom leads 1100 to the number of upper J-bent leads 1204 to form the stack of semiconductor packages 1500. Typically, the second semiconductor package 1502 is attached to the bottom semiconductor package 1200 at board assembly to avoid possible damage to the numbers of leads that may occur while picking and placing the stacked semiconductor packages 1500 as a unit.

It will be apparent to those skilled in the art upon a reading of this disclosure that the second semiconductor package 1102 may also include a number of upper leads for stacking another semiconductor package onto the second semiconductor package 1502.

Referring now to FIG. 11, therein is shown a cross-sectional view of the structure of FIG. 11 taken along line 11-11. The number of bottom leads 1100 is connected to the number of upper J-bent leads 1104 to connect the second semiconductor package 1102 to the bottom semiconductor package 1200.

Referring now to FIG. 11, therein is shown a top view of a semiconductor package 1100 with a number of lower terminal pads 1102 and a number of upper terminal pads 1104 on opposing sides of the semiconductor package 1100. The semiconductor package 1100 includes an encapsulant 1108 from which the number of lower terminal pads 1102 and the number of upper terminal pads 1104 are exposed. The encapsulant 1208 typically is a plastic, epoxy resin, or other suitable molding compound. The encapsulant typically has a sloped perimeter 1111 to facilitate removal of the semiconductor package 1100 from a mold.

Referring now to FIG. 11, therein is shown a cross-sectional view of the structure of FIG. 11 taken along line 11-11. The semiconductor package 1100 includes a die pad 1100. An integrated circuit chip, or a die 1102, is attached to the die pad 1100 using a suitable adhesive layer 1104, such as a conductive adhesive paste or tape. The die 1102 is wire bonded to a number of upper gull-wing leads 1105 that terminate in the upper terminal pads 1104 using a number of bonding wires 1108, such as a plurality of fine, conductive wires, typically gold (Au) or aluminum (Al).

The encapsulant 1108 encloses the die 1102 and the number of bonding wires 1108. The number of upper gull-wing leads 1105 is embedded in the encapsulant 1108 to expose a surface of the upper terminal pads 1104 to allow electrical connection of the die 1102 to a second semiconductor package as explained below.

Figure 20:
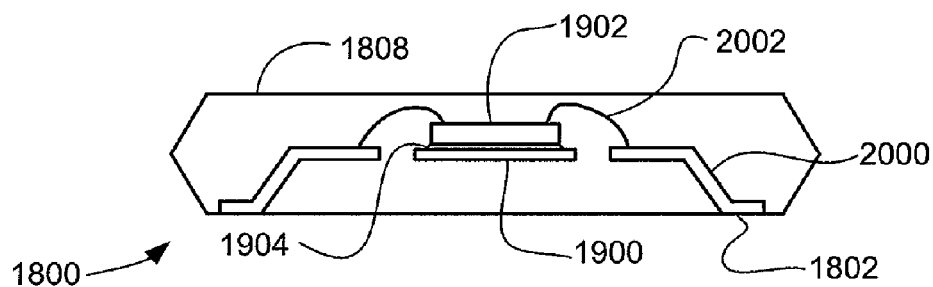
FIG. 20 is a cross-sectional view of the structure of FIG. 18 taken along line 20-20.

Referring now to FIG. 20, therein is shown a cross-sectional view of the structure of FIG. 11 taken along line 20-20. The die 1102 is wire bonded to a number of lower gull-wing leads 2000 that terminate in the number of lower terminal pads 1102 using a third number of bonding wires 2002. The third number of bonding wires 2002 is connected using any suitable wire bonding process. The number of lower gull-wing leads 2000 is embedded in the encapsulant 1108 to expose a surface of the lower terminal pads 1102 to allow electrical connection of the die 1102 to another semiconductor package or printed circuit board (PCB).

Figure 21:
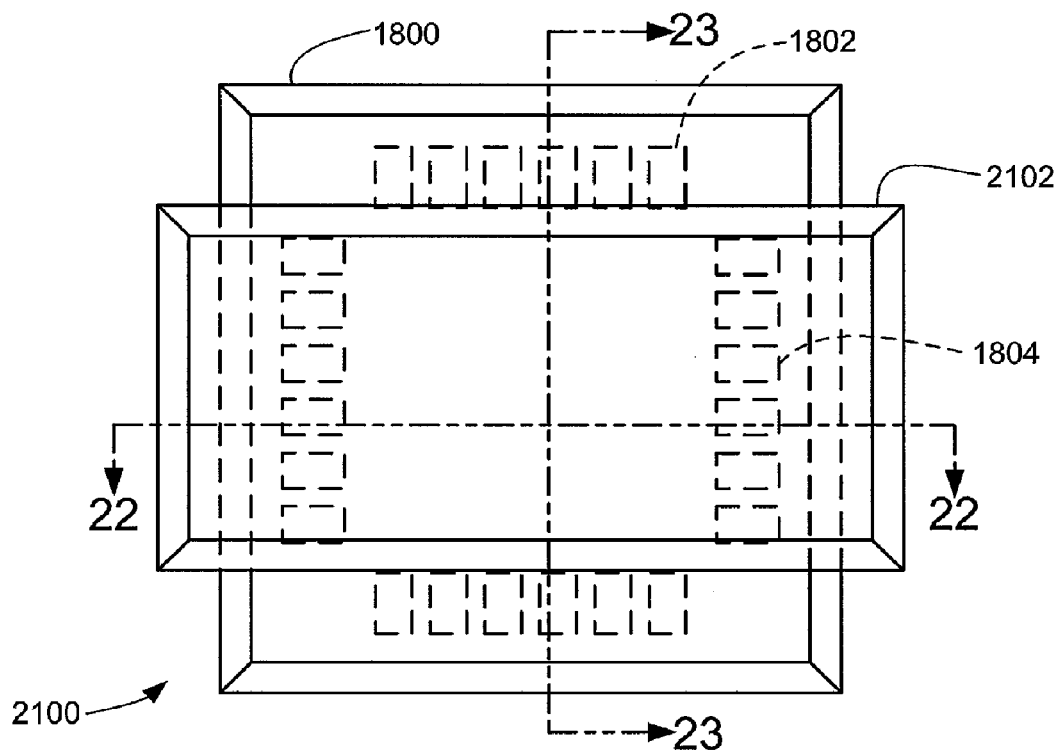
FIG. 21 is a top view of stacked semiconductor packages with upper and lower terminal leads on opposing sides of the lower semiconductor package.

Referring now to FIG. 21, therein is shown a top view of a stack of semiconductor packages 2110 with the number of lower terminal pads 1102 and the number of upper terminal pads 1104 on opposing sides of the bottom semiconductor package 1100. The semiconductor package 1100 shown in FIGS. 11-20 is the bottom semiconductor package 1100 shown in FIG. 20. A second semiconductor package 2112 is attached to the upper terminal pads 1104 of the bottom semiconductor package 1100.

Figure 22:
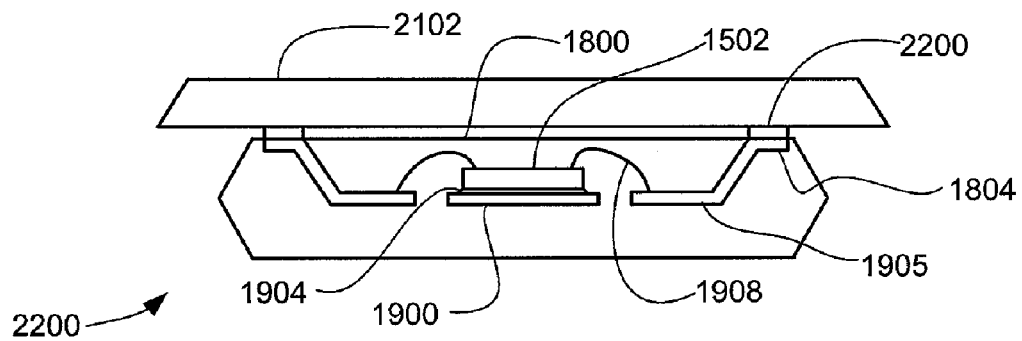
FIG. 22 is a cross-sectional view of the structure of FIG. 21 taken along line 22-22.

Referring now to FIG. 22, therein is shown a cross-sectional view of the structure of FIG. 21 taken along line 22-22. The second semiconductor package 2102 is connected to the bottom semiconductor package 1800. The second semiconductor package 2102 is a bottom leaded semiconductor package having a number of bottom leads 2200. The number of bottom leads 2200 is soldered to the number of upper terminal pads 1104 using a solder, such as a eutectic solder, a high lead solder, a lead-free solder, a pre-form solder, an electrically and thermally conductive paste adhesive, an electrically and thermally conductive film adhesive, and combinations thereof.

Other suitable bonding techniques, such as compression bonding or ultrasonic bonding, for example, also may be used to connect the number of bottom leads 2200 to the number of upper terminal pads 1804 to form the stack of semiconductor packages 2100. Typically, the second semiconductor package 2102 is attached to the bottom semiconductor package 1100 at board assembly to avoid possible damage to the numbers of leads that may occur while picking and placing the stacked semiconductor packages 2100 as a unit.

It will be apparent to those skilled in the art upon a reading of this disclosure that the second semiconductor package 2112 may also include a number of upper leads or terminal pads for stacking another semiconductor package onto the second semiconductor package 2102.

Figure 23:
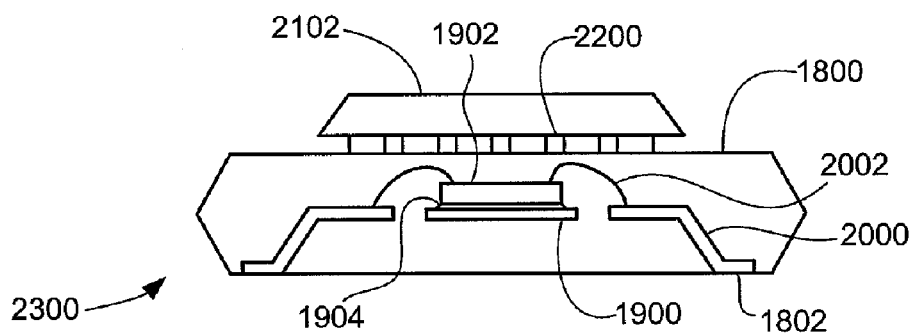
FIG. 23 is a cross-sectional view of the structure of FIG. 21 taken along line 23-23.

Referring now to FIG. 23, therein is shown a cross-sectional view of the structure of FIG. 21 taken along line 23-23. The number of bottom leads 2200 is connected to the number of upper terminal pads 1104 shown in FIG. 22 to connect the second semiconductor package 2102 to the bottom semiconductor package 1800. The number of lower terminal pads 1102 is exposed through the encapsulant for connection of the bottom semiconductor package 1100 to another semiconductor package or a PCB.

Figure 24:
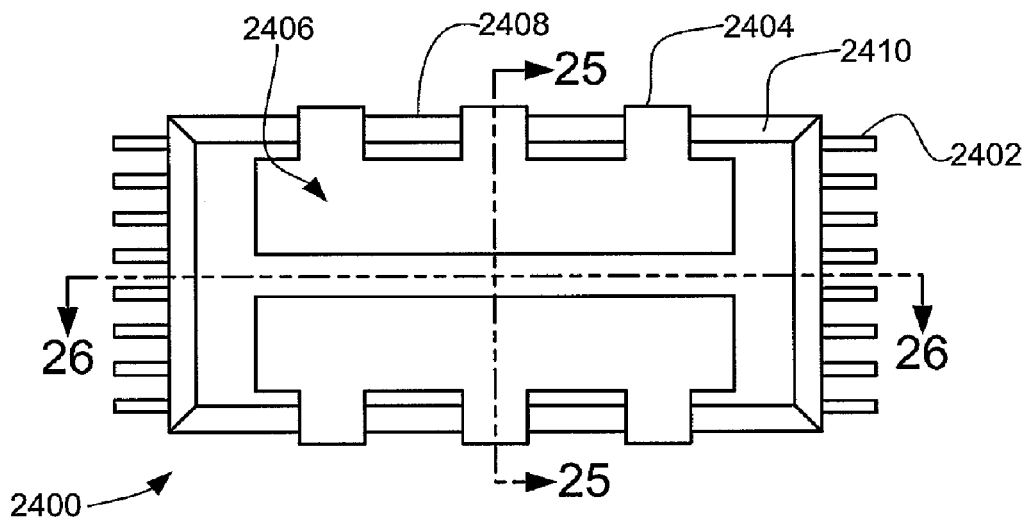
FIG. 24 is a top view of a semiconductor package with lower J-bent leads on opposing sides of the semiconductor package and a wrap around die pad.

Referring now to FIG. 24, therein is shown a top view of a semiconductor package 2400 with a number of lower J-bent leads 2402 on opposing sides of the semiconductor package 2400 and a wrap around die pad 2404 having an upper surface 2406. The wrap around die pad 2404 extends outwardly from opposing sides of an encapsulant 2408 and is positioned over the encapsulant 2408. The encapsulant 2408 typically is a plastic, epoxy resin, or other suitable molding compound. The encapsulant 2408 typically has a sloped perimeter 2411 to facilitate removal of the semiconductor package 2400 from a mold.

Figure 25:
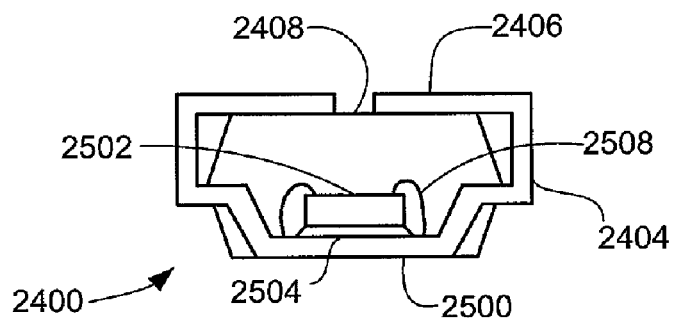
FIG. 25 is a cross-sectional view of the structure of FIG. 24 taken along line 25-25.

Referring now to FIG. 25, therein is shown a cross-sectional view of the structure of FIG. 24 taken along line 25-25. The semiconductor package 2400 includes a wrap around die pad 2500. An integrated circuit chip, or a die 2502, is attached to the wrap around die pad 2500 using a suitable adhesive layer 2504, such as a conductive adhesive paste or tape. The die 2502 is wire bonded to the wrap around die pad 2500 using a number of bonding wires 2508, such as a plurality of fine, conductive wires, typically gold (Au) or aluminum (Al).

The encapsulant 2408 encloses the die 2502 and the number of bonding wires 2508 and exposes a lower surface of the wrap around die pad 2500. The wrap around die pad 2500 extends outwardly through the encapsulant 2408 and wraps around the top of the encapsulant 2408 to form the upper surface 2406 of the wrap around die pad 2500 to allow electrical connection of the die 2502 to a second semiconductor package as explained below.

Figure 26:
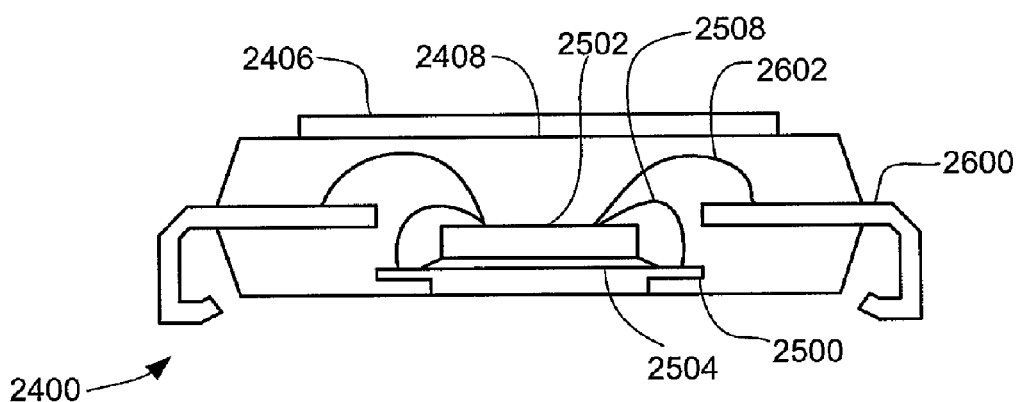
FIG. 26 is a cross-sectional view of the structure of FIG. 24 taken along line 26-26.

Referring now to FIG. 26, therein is shown a cross-sectional view of the structure of FIG. 24 taken along line 26-26. The die 2502 is wire bonded to a number of lower J-bent leads 2600 using a third number of bonding wires 2602. The third number of bonding wires 2602 is connected using any suitable wire bonding process. The number of lower J-bent leads 2600 extends through the encapsulant 2408 to allow electrical connection of the die 2502 to another semiconductor package or printed circuit board (PCB). It will be apparent to those skilled in the art upon a reading of this description that the number of lower J-bent leads 2600 may be gull-wing leads as described above.

Figure 27:
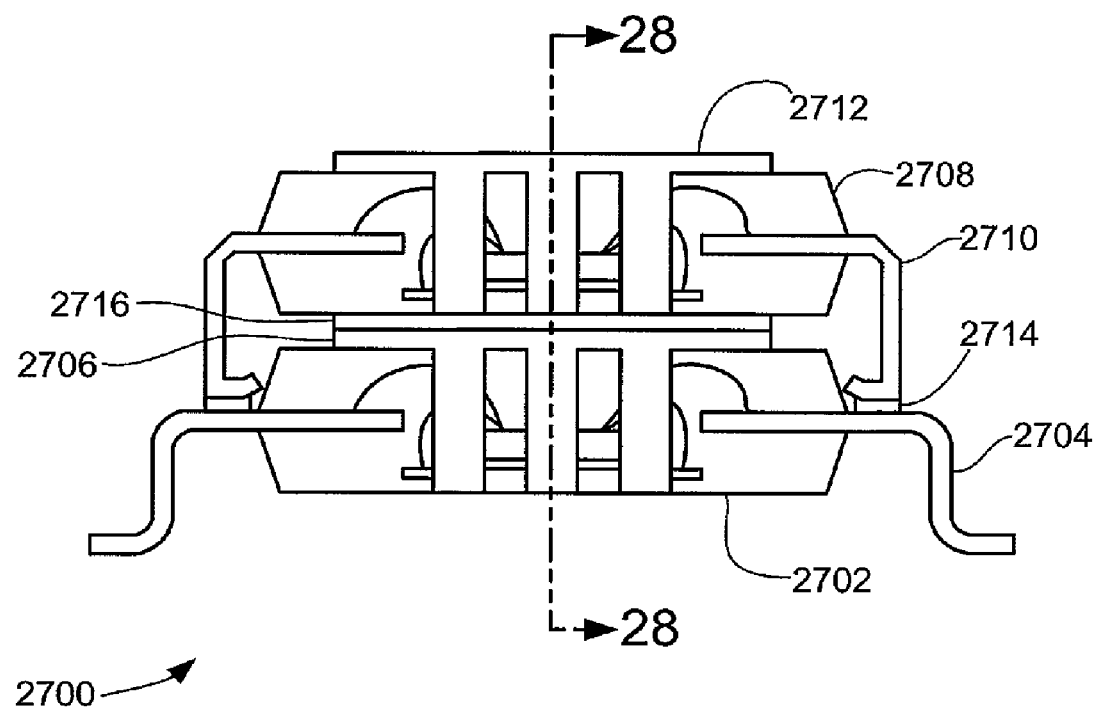
FIG. 27 is a side view of stacked semiconductor packages with lower gull-wing leads, lower J-bent leads, and a wrap around die pad.

FIG. 27 is a cross-sectional view of a stack of semiconductor packages 2700 with a bottom semiconductor package 2702 having a number of lower gull-wing leads 2704 and a first wrap around die pad 2706 and a second semiconductor package 2708 having a number of lower J-bent leads 2710 and a second wrap around die pad 2712.

The second semiconductor package 2708 is connected to the bottom semiconductor package 2702. The number of lower J-bent leads 2710 is soldered to the number of lower gull-wing leads 2704 using a solder 2714, such as a eutectic solder, a high lead solder, a lead-free solder, a pre-form solder, an electrically and thermally conductive paste adhesive, an electrically and thermally conductive film adhesive, and combinations thereof.

Other suitable bonding techniques, such as compression bonding or ultrasonic bonding, for example, also may be used to connect the number of lower J-bent leads 2710 to the number of lower gull-wing leads 2704 to form the stack of semiconductor packages 2700. Typically, the second semiconductor package 2708 is attached to the bottom semiconductor package 2702 at board assembly to avoid possible damage to the numbers of leads that may occur while picking and placing the stack of semiconductor packages 2700 as a unit.

The second wrap around die pad 2712 is attached to the first wrap around die pad 2706 using an adhesive layer 2711, such as a conductive adhesive paste or adhesive tape.

It will be apparent to those skilled in the art upon a reading of this disclosure that the second semiconductor package 2708 may also have another semiconductor package stacked on top of the second semiconductor package 2708 to form a stack of more than two semiconductor packages.

Figure 28:
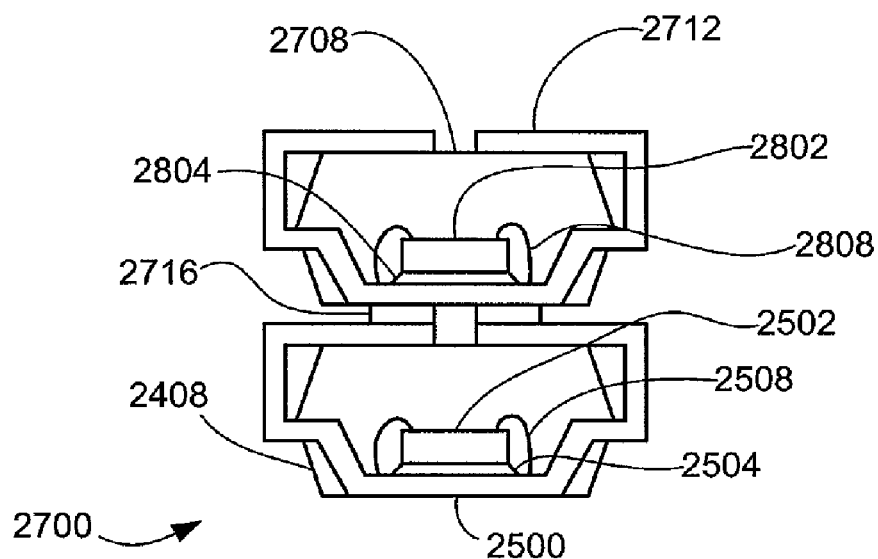
FIG. 28 is a cross-sectional view of the structure of FIG. 27 taken along line 28-28.

Referring now to FIG. 28, therein is shown a side view of the structure of FIG. 27 taken along line 28-28. The first wrap around die pad 2706 is connected to the second wrap around die pad 2712 to connect the second semiconductor package 2708 to the bottom semiconductor package 2702 using the adhesive layer 2711.

Figure 29:
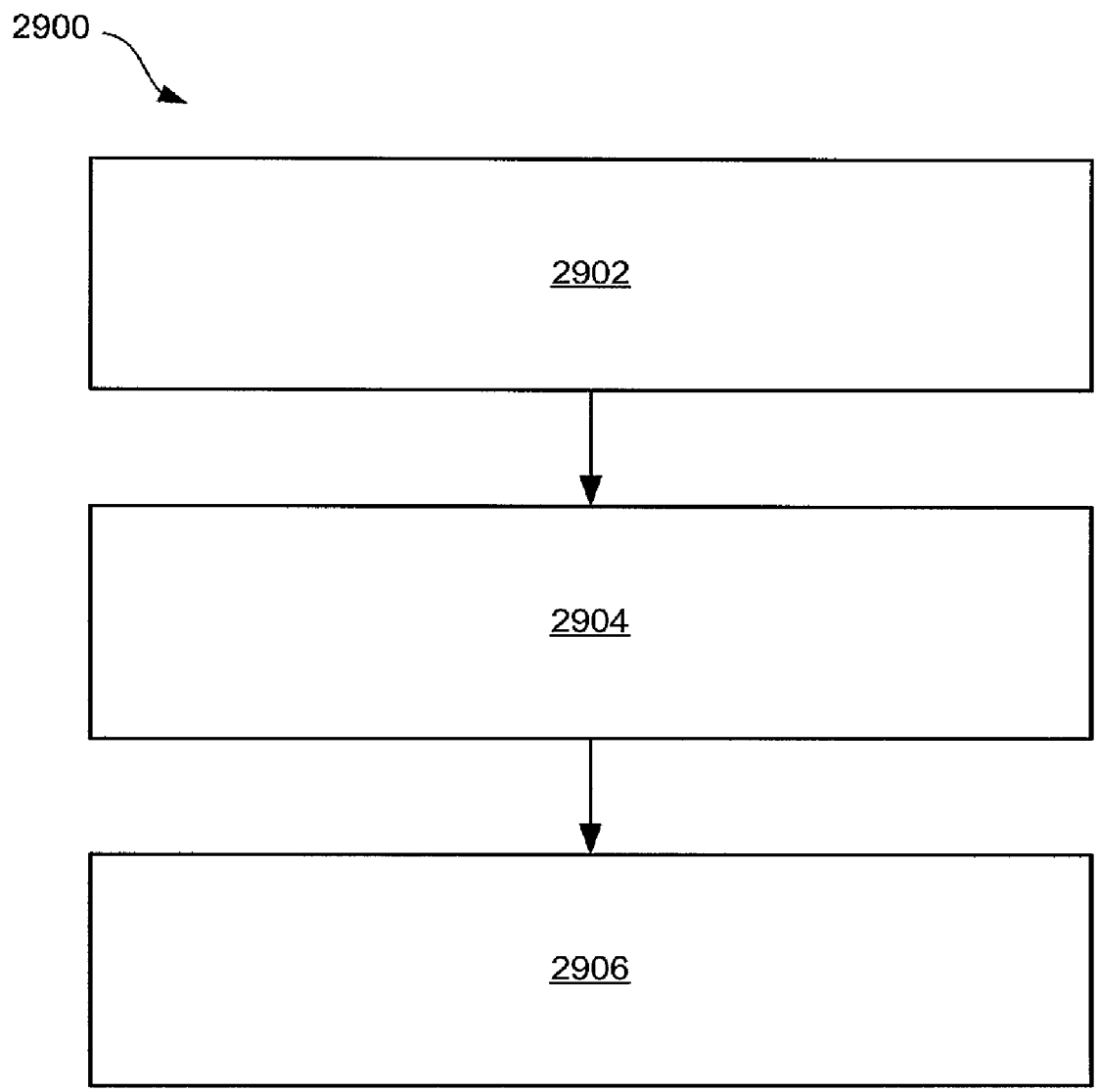
FIG. 29 is a flow chart of a method for stacking semiconductor packages in accordance with the present invention.

Referring now to FIG. 29, therein is shown a flow chart of a method 2900 for stacking semiconductor packages in accordance with the present invention. The method 2900 includes providing a first semiconductor package having a first plurality of lower leads and a first plurality of upper leads in a block 2902; providing a second semiconductor package having a second plurality of lower leads in a block 2904; and attaching the second plurality of lower leads to the first plurality of upper leads in a block 2906.

Thus, it has been discovered that the method and apparatus of the present invention furnish important and heretofore unavailable solutions, capabilities, and functional advantages for stacking semiconductor packages. The resulting process and configurations are straightforward, economical, uncomplicated, highly versatile, and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of stacking semiconductor packages comprising:
   providing a first semiconductor package having a first plurality of lower leads and a first plurality of upper leads;
   providing a second semiconductor package having a second plurality of lower leads; and attaching the second plurality of lower leads to the first plurality of upper leads.

2. The method of stacking semiconductor packages as claimed in claim 1, wherein:
   providing a first semiconductor package provides a first plurality of lower leads on opposing edges of the first semiconductor package and provides a second plurality of upper leads on opposing edges of the first semiconductor package.

3. The method of stacking semiconductor packages as claimed in claim 1, wherein:
   providing a first semiconductor package having a first plurality of upper leads provides at least one of gull-wing leads, J-bent leads, terminal pads, wrap around die pads, and combinations thereof.

4. The method of stacking semiconductor packages as claimed in claim 1, wherein:
   providing a second semiconductor package having a second plurality of lower leads provides at least one of gull-wing leads, J-bent leads, terminal pads, and combinations thereof.

5. The method of stacking semiconductor packages as claimed in claim 1, wherein:
   providing a first semiconductor package and providing a second semiconductor package provide a first wrap around die pad and a second wrap around die pad respectively; and further comprises:
attaching the second wrap around die pad to the first wrap around die pad.

6. A method of manufacturing a stackable semiconductor package comprising:
    providing a die pad;
    attaching a die to the die pad;
    providing a plurality of lower leads adjacent opposing sides of the die pad;
    providing a plurality of upper leads adjacent alternate opposing sides of the die pad;
    wire bonding the die to the die pad, the plurality of lower leads, and the plurality of upper leads; and
    encapsulating the die to expose a lower surface of the die pad, a portion of the plurality of lower leads, and a portion of the plurality of upper leads.

7. The method of manufacturing a stackable semiconductor package as claimed in claim 6, wherein:
    providing a plurality of upper leads provides at least one of gull-wing leads, J-bent leads, terminal pads, wrap around die pads, and combinations thereof.

8. The method of manufacturing a stackable semiconductor package as claimed in claim 6, wherein:
    providing a plurality of lower leads provides at least one of gull-wing leads, J-bent leads, terminal pads, and combinations thereof.

9. The method of manufacturing a stackable semiconductor package as claimed in claim 6, wherein:
    providing a plurality of upper leads provides a widened lead tip.

10. The method of manufacturing a stackable semiconductor package as claimed in claim 6, wherein:
    providing a plurality of upper leads provides a plated lead tip.

11. A stack of semiconductor packages comprising:
    a first semiconductor package having a first plurality of lower leads and a first plurality of upper leads; and
    a second semiconductor package having a second plurality of lower leads attached to the first plurality of upper leads.

12. The stack of semiconductor packages as claimed in claim 11, wherein:
    the first semiconductor package comprises a first plurality of lower leads on opposing edges of the first semiconductor package and a second plurality of upper leads on opposing edges of the first semiconductor package.

13. The stack of semiconductor packages as claimed in claim 11, wherein:
    the first semiconductor package having a first plurality of upper leads comprises at least one of gull-wing leads, J-bent leads, terminal pads, wrap around die pads, and combinations thereof.

14. The stack of semiconductor packages as claimed in claim 11, wherein:
    the second semiconductor package having a second plurality of lower leads comprises at least one of gull-wing leads, J-bent leads, terminal pads, and combinations thereof.

15. The stack of semiconductor packages as claimed in claim 11, wherein:
    the first semiconductor package comprises a first wrap around die pad;
    the second semiconductor package comprises a second wrap around die pad; and
    the second wrap around die pad is attached to the first wrap around die pad.

16. A stackable semiconductor package comprising:
    a die pad;
    a die attached to the die pad;
    a plurality of lower leads adjacent opposing sides of the die pad;
    a plurality of upper leads adjacent alternate opposing sides of the die pad;
    wires bonding the die to the die pad, the plurality of lower leads, and the plurality of upper leads; and
    an encapsulant to expose a lower surface of the die pad, a portion of the plurality of lower leads, and a portion of the plurality of upper leads.

17. The stackable semiconductor package as claimed in claim 16, wherein:
    the plurality of upper leads comprises at least one of gull-wing leads, J-bent leads, terminal pads, wrap around die pads, and combinations thereof.

18. The stackable semiconductor package as claimed in claim 16, wherein:
    the plurality of lower leads comprises at least one of gull-wing leads, J-bent leads, terminal pads, and combinations thereof.

19. The stackable semiconductor package as claimed in claim 16, wherein:
    the plurality of upper leads comprises a widened lead tip.

20. The stackable semiconductor package as claimed in claim 16, wherein:
    the plurality of upper leads comprises a plated lead tip.

* * * * *

UNITED STATES PATENT AND TRADEMARK OFFICE
CERTIFICATE OF CORRECTION

PATENT NO. : 7,242,091 B2
APPLICATION NO. : 10/906697
DATED : July 10, 2007
INVENTOR(S) : Ramakrishna et al.

It is certified that error appears in the above-identified patent and that said Letters Patent is hereby corrected as shown below:

Column 3, line 65, delete "110" and insert therefor --100--; line 66, delete "112" and insert therefor --102--; line 66, delete "114" and insert therefor --104--; and line 67, delete "110" and insert therefor --100--

Column 4, line 1, delete "112" and insert therefor --102--; line 2, delete "116" and insert therefor --106--; line 3, delete "116" and insert therefor --106--; line 4, delete "112" and insert therefor --102--; line 5, delete "110" and insert therefor --100--; line 5, delete "118" and insert therefor --108--; line 6, delete "112" and insert therefor --102--; line 7, delete "114" and insert therefor --104--; line 7, delete "118" and insert therefor --108--; line 10, delete "111" and insert therefor --110--; line 10, delete "110" and insert therefor --100--; line 14, delete "110" and insert therefor --100--; line 21, delete "112" and insert therefor --102--; line 23, delete "118" and insert therefor --108--; line 24, delete "112" and insert therefor --102--; line 25, delete "118" and insert therefor --108--; line 30, delete "114" and insert therefor --104--; line 33, delete "114" and insert therefor --104--; line 38, delete "112" and insert therefor --102--; line 39, delete "114" and insert therefor --104--; line 39, delete "110" and insert therefor --100--; line 40, delete "110" and insert therefor --100--; line 41, delete "110" and insert therefor --100--; line 43, delete "110" and insert therefor --100--; line 48, delete "112" and insert therefor --102--; line 49, delete "116" and insert therefor --106--; line 54, delete "110" and insert therefor --100--; line 56, delete "112" and insert therefor --102--; line 56, delete "116" and insert therefor --106--; line 64, delete "112" and insert therefor --102--; and line 67, delete "110" and insert therefor --100--

Figure 10:
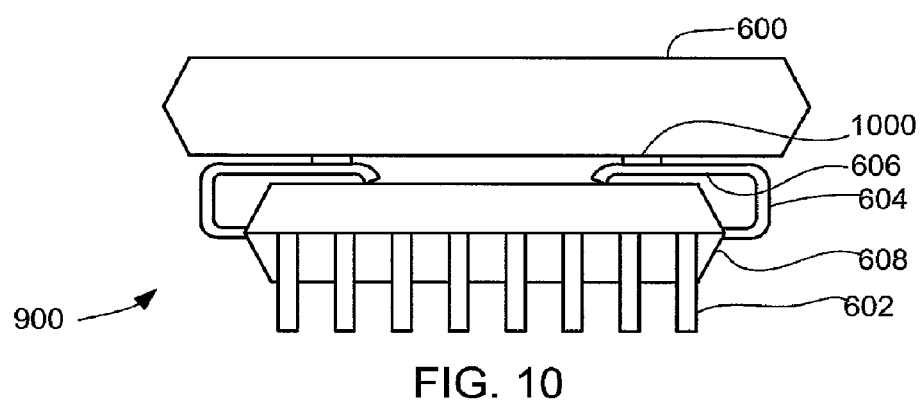
FIG. 10 is a cross-sectional view of the structure of FIG. 9 taken along line 10-10.

Column 5, line 58, delete "FIG. 11," and insert therefor --FIG. 10,--; line 60, delete "11-11" and insert therefor --10-10--; and line 63, delete "1100" and insert therefor --1000--

Column 6, line 5, delete "1100" and insert therefor --1000--; line 20, delete "1100" and insert therefor --1000--; line 39, delete "FIG. 11," and insert therefor --FIG. 13,--; line 42, delete "1100" and insert therefor --1300--; line 42, delete "1102" and insert therefor --1302--; line 43, delete "1100" and insert therefor --1300--; line 43, delete "1104" and insert therefor --1304--; line 44, delete "1102" and insert therefor --1302--; line 45, delete "1100" and insert therefor --1300--; line 46, delete "1106" and insert therefor --1306--;

UNITED STATES PATENT AND TRADEMARK OFFICE
CERTIFICATE OF CORRECTION

PATENT NO.         : 7,242,091 B2
APPLICATION NO. : 10/906697
DATED                  : July 10, 2007
INVENTOR(S)        : Ramakrishna et al.

Figure 15:
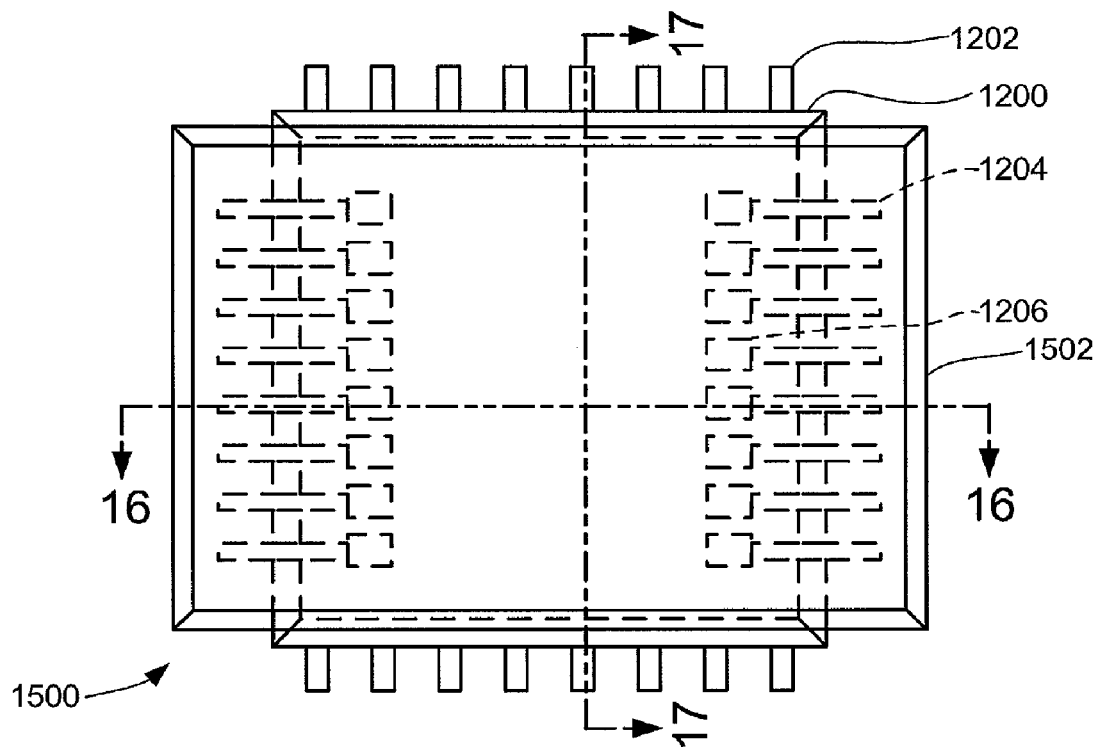
FIG. 15 is a top view of stacked semiconductor packages with upper and lower J-bent leads on opposing sides of one of the semiconductor packages.

It is certified that error appears in the above-identified patent and that said Letters Patent is hereby corrected as shown below:

<u>Column 6</u>, line 53, delete "1102" and insert therefor --1302--; line 55, delete "FIG. 11" and insert therefor --FIG. 14--; line 61, delete "1102" and insert therefor --1202--; and line 63, delete "FIG. 11" and insert therefor --FIG. 15--

Figure 16:
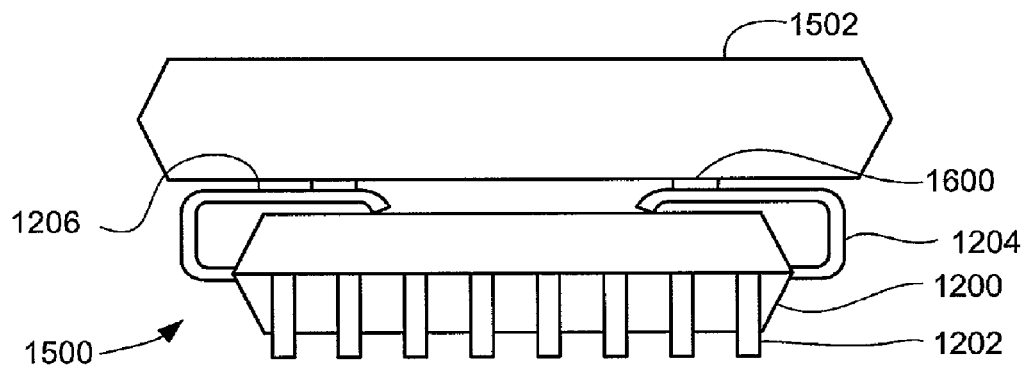
FIG. 16 is a cross-sectional view of the structure of FIG. 15 taken along line 16-16.
Figure 17:
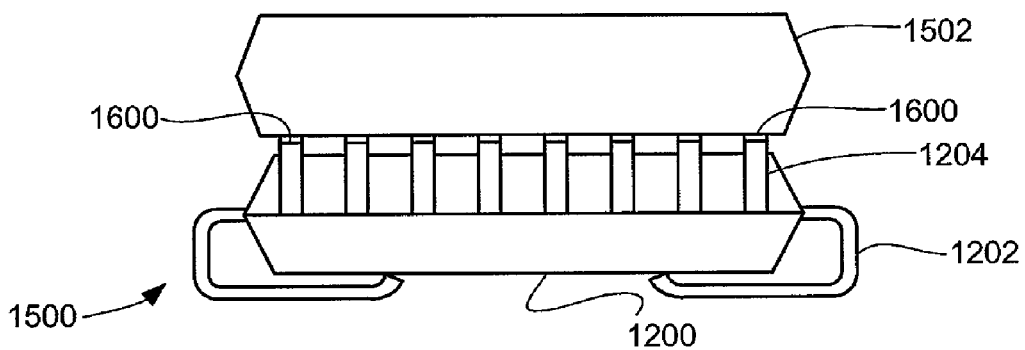
FIG. 17 is a cross-sectional view of the structure of FIG. 15 taken along line 17-17.
Figure 18:
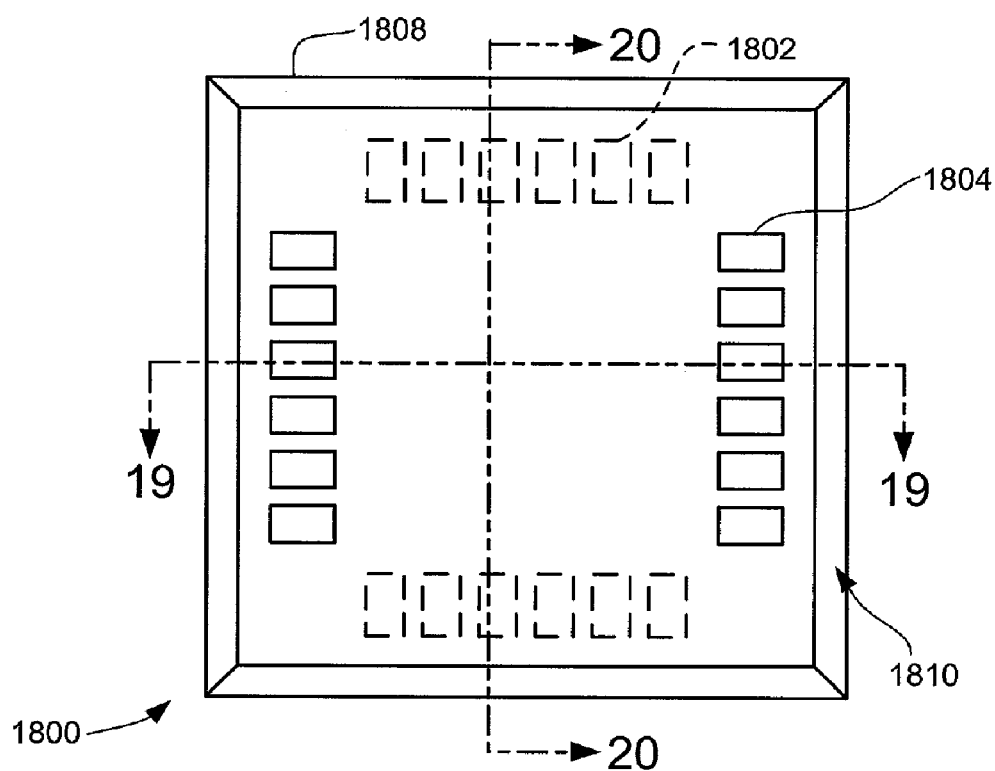
FIG. 18 is a top view of a semiconductor package with upper and lower terminal pads on opposing sides of one of the semiconductor packages.
Figure 19:
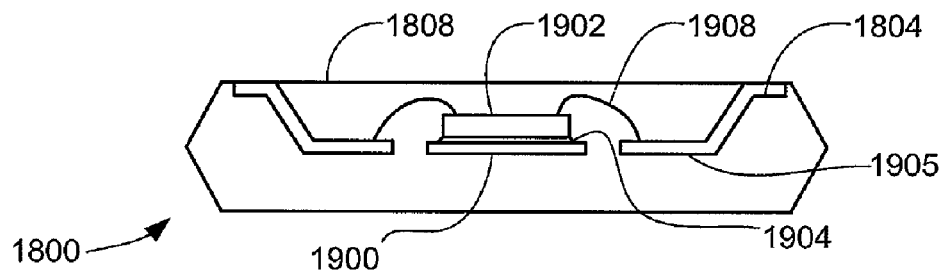
FIG. 19 is a cross-sectional view of the structure of FIG. 18 taken along line 19-19.

<u>Column 7</u>, line 6, delete "FIG. 11" and insert therefor --FIG. 16--; line 7, delete "FIG. 11" and insert therefor --FIG. 15--; line 8, delete "11-11" and insert therefor --16-16--; line 8, delete "1102" and insert therefor --1502--; line 12, delete "1100" and insert therefor --1600--; line 14, delete "1106" and insert therefor --1206--; line 21, delete "1100" and insert therefor --1600--; line 32, delete "1102" and insert therefor --1502--; line 34, delete "FIG. 11," and insert therefor --FIG. 17,--; line 35, delete "FIG. 11" and insert therefor --FIG. 15--; line 36, delete "11-11" and insert therefor --17-17--; line 36, delete "1100" and insert therefor --1600--; line 37, delete "1104" and insert therefor --1204--; line 38, delete "1102" and insert therefor --1502--; line 41, delete "FIG. 11" and insert therefor --FIG. 18--; line 42, delete "1100" and insert therefor --1800--; line 43, delete "1102" and insert therefor --1802--; line 44, delete "1104" and insert therefor --1804--; line 44, delete "1100" and insert therefor --1800--; line 45, delete "1100" and insert therefor --1800--; line 46, delete "1108" and insert therefor --1808--; line 46, delete "1102" and insert therefor --1802--; line 47, delete "1104" and insert therefor --1804--; line 50, delete "1111" and insert therefor --1810--; line 51, delete "1100" and insert therefor --1800--; line 52, delete "FIG. 11," and insert therefor --FIG. 19,--; line 53, delete "FIG. 11" and insert therefor --FIG. 18--; line 54, delete "11-11" and insert therefor --19-19--; line 54, delete "1100" and insert therefor --1800--; line 55, delete "1100" and insert therefor --1900--; line 55, delete "1102" and insert therefor --1902--; line 56, delete "1100" and insert therefor --1900--; line 56, delete "1104" and insert therefor --1904--; line 57, delete "1102" and insert therefor --1902--; line 58, delete "1105" and insert therefor --1905--; line 59, delete "1104" and insert therefor --1804--; line 60, delete "1108" and insert therefor --1908--; line 62, delete "1108" and insert therefor --1808--; line 62, delete "1102" and insert therefor --1902--; line 63, delete "1108" and insert therefor --1908--; line 64, delete "1105" and insert therefor --1905--; line 64, delete "1108" and insert therefor --1808--; line 65, delete "1104" and insert therefor --1804--; and line 65, delete "1102" and insert therefor --1902--

<u>Column 8</u>, line 2, delete "FIG. 11" and insert therefor --FIG. 18--; line 3, delete "1102" and insert therefor --1902--; line 5, delete "1102" and insert therefor --1802--; line 9, delete "1108" and insert therefor --1808--; line 9, delete "1102" and insert therefor --1802--; line 10, delete "1102" and insert therefor --1902--;

UNITED STATES PATENT AND TRADEMARK OFFICE
CERTIFICATE OF CORRECTION

PATENT NO. : 7,242,091 B2  
APPLICATION NO. : 10/906697  
DATED : July 10, 2007  
INVENTOR(S) : Ramakrishna et al.

Page 3 of 3

It is certified that error appears in the above-identified patent and that said Letters Patent is hereby corrected as shown below:

<u>Column 8</u>, line 13, delete "2110" and insert therefor --2100--; line 14, delete "1102" and insert therefor --1802--; line 15, delete "1104" and insert therefor --1804--; line 16, delete "1100." and insert therefor --1800.--; line 16, delete "1100 shown" and insert therefor --1800 shown--; line 17, delete "FIGS. 11-20" and insert therefor --FIGS. 18-20--; line 17, delete "1100" and insert therefor --1800--; line 18, delete "2112" and insert therefor --2102--; line 19, delete "1104" and insert therefor --1804--; line 20, delete "1100" and insert therefor --1800--; line 28, delete "1104" and insert therefor --1804--; line 39, delete "1100" and insert therefor --1800--; line 45, delete "2112" and insert therefor --2102--; line 51, delete "1104" and insert therefor --1804--; line 54, delete "1102" and insert therefor --1802--; line 55, delete "1100" and insert therefor --1800--; and line 66, delete "2411" and insert therefor --2410--

<u>Column 9</u>, line 57, delete "2711" and insert therefor --2716--

<u>Column 10</u>, line 2, delete "2711" and insert therefor --2716--

Signed and Sealed this

Twenty Second Day of April, 2008

JON W. DUDAS  
*Director of the United States Patent and Trademark Office*